United States Patent [19]

Weinstock et al.

[11] Patent Number: 5,592,086

[45] Date of Patent: Jan. 7, 1997

[54] AUTOMATED COMPUTERIZED MAGNETIC RESONANCE DETECTOR AND ANALYZER

[76] Inventors: Ronald J. Weinstock; Sigrid Lipsett, both of 2083 Lindengrove St., Westlake Village, Ventura County, Calif. 91361

[21] Appl. No.: 326,459

[22] Filed: Oct. 19, 1994

Related U.S. Application Data

[63] Continuation-in-part of Ser. No. 229,605, Apr. 19, 1994, which is a continuation-in-part of Ser. No. 945,529, Sep. 16, 1992, Pat. No. 5,317,265.

[51] Int. Cl.⁶ .................................................. G01R 33/28
[52] U.S. Cl. .......................... 324/318; 324/307; 128/653.2
[58] Field of Search ...................................... 324/309, 300, 324/318, 314, 312, 322, 313, 301, 307; 128/653.5; 335/299

[56] References Cited

U.S. PATENT DOCUMENTS

| | | | |
|---|---|---|---|
| 3,568,047 | 3/1971 | Look et al. | 324/0.5 |
| 3,609,317 | 9/1971 | Siebert | 324/312 |
| 3,824,452 | 7/1974 | Freeman et al. | 324/314 |
| 4,455,527 | 6/1984 | Singer | 324/316 |
| 4,593,246 | 6/1986 | Hill | 324/307 |
| 4,602,213 | 7/1986 | Sugiura | 324/307 |
| 4,654,597 | 3/1987 | Hino | 324/322 |
| 4,656,425 | 4/1987 | Tsur et al. | 324/309 |
| 4,694,254 | 9/1987 | Vatis et al. | 324/314 |
| 4,703,267 | 10/1987 | Maudsley | 324/307 |
| 4,739,268 | 4/1988 | Fox | 324/314 |
| 4,740,750 | 4/1988 | Machida | 324/312 |
| 5,053,709 | 10/1991 | Mitomi | 324/309 |
| 5,072,732 | 12/1991 | Rapoport et al. | 324/308 |
| 5,149,946 | 9/1992 | Jerome et al. | 324/300 |
| 5,208,537 | 5/1993 | Rietsch et al. | 324/322 |
| 5,231,354 | 7/1993 | Leuubach | 324/316 |
| 5,317,265 | 5/1994 | Weinstock et al. | 324/318 |

*Primary Examiner*—Sandra L. O'Shea
*Assistant Examiner*—Raymond Y. Mah
*Attorney, Agent, or Firm*—Morrison & Foerster

[57] ABSTRACT

A magnetic resonance apparatus is provided to analyze, diagnose, or treat matter. In general, the MRA is used to transmit a synthesized resonance pattern into the subject matter under test which encounters the inherent resonance pattern produced by the tested subject matter. This information is returned to the MRA, which, after removing the static capacity and resistance, is analyzed, digitized and compared to a coded predetermined resonance pattern and examined for irregularities. The presence or lack of irregularities can be used to analyze and diagnose matter. A second set of test pattern signals can also be applied to alter the substance's natural magnetic resonance, thereby treating the substance to achieve a particular resonance pattern.

1 Claim, 8 Drawing Sheets

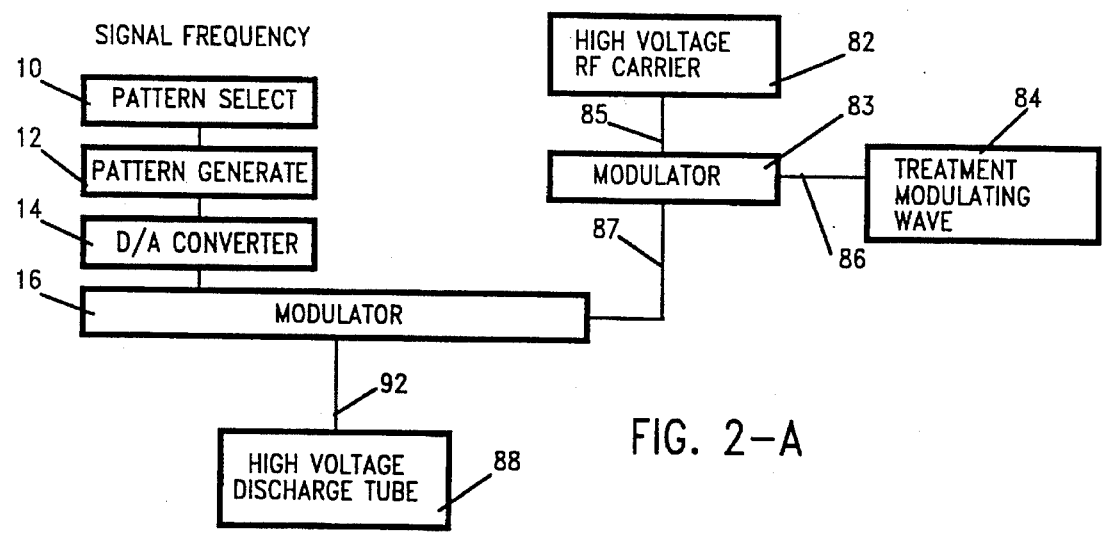
FIG. 2-A

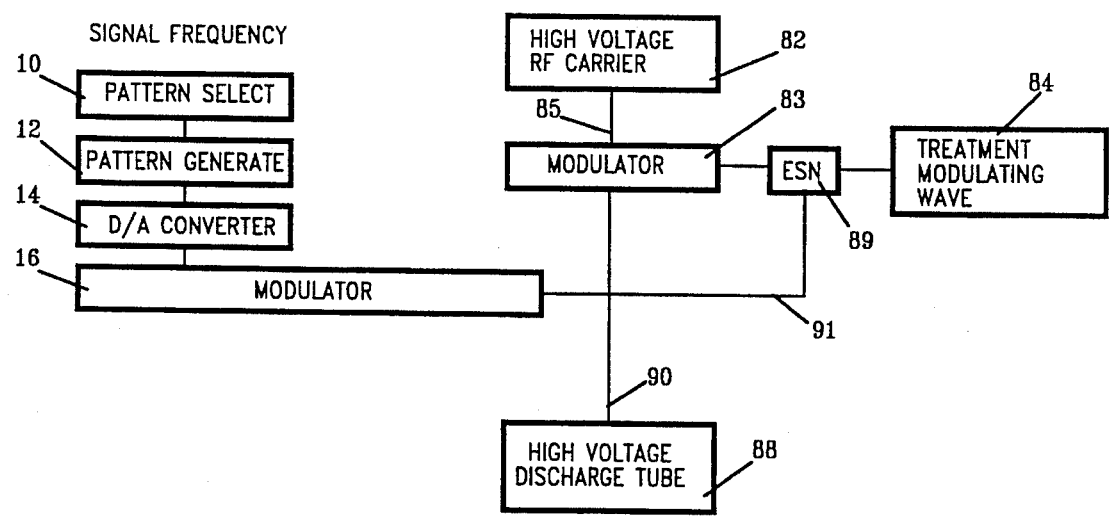
FIG. 2-B

FIGURE 3A

MAGNETIC RESONANCE SCREENING PANEL

| Normal | Abnormal | Organ/Tissue | Normal | Abnormal | Organ/Tissue |
|---|---|---|---|---|---|
| ___ | ___ | Adenoids | | | Brain: Right Temporal Lobe |
| ___ | ___ | Adrenal Cortex | | | |
| ___ | ___ | Adrenal Medulla | ___ | ___ | Breast |
| ___ | ___ | Adrenal Whole Gland | ___ | ___ | Bronchi |
| ___ | ___ | Anal Canal | ___ | ___ | Bronchioles |
| ___ | ___ | Anal Sphincter | ___ | ___ | Capillaries |
| ___ | ___ | Appendix | ___ | ___ | Cardiac Pacemaker |
| ___ | ___ | Arterial Tissue | ___ | ___ | Cardio-Vascular Organs |
| ___ | ___ | Arteries | ___ | ___ | Cartoid Arteries |
| ___ | ___ | Arteries | ___ | ___ | Cartilage |
| ___ | ___ | Arteries (hardening) | ___ | ___ | Central Nervous System |
| ___ | ___ | Ascending Colon | ___ | ___ | Cerebral Artery – Anterior |
| ___ | ___ | Atriovent (Tricspd) Vlve-Rtt | ___ | ___ | Cerebral Artery – Middle |
| ___ | ___ | Atrium of Heart-left | ___ | ___ | Cerebral Artery – Posterior |
| ___ | ___ | Atrium of Heart-right | | | |
| | | Atrovent (Bicuspd) Vlve-Lt | ___ | ___ | Cerebral Cortex |
| | | | ___ | ___ | Colon (Torpor) |
| ___ | ___ | Auditory Nerve | ___ | ___ | Duodenum |
| ___ | ___ | Autonomic Nervous System | ___ | ___ | Ear – Semicircular canal |
| | | | ___ | ___ | Ear – Semicircular Ducts |
| ___ | ___ | Axillary Artery | ___ | ___ | Fat Cells |
| ___ | ___ | Bladder | ___ | ___ | Fibrillar Connective Tissues |
| ___ | ___ | Blood | | | |
| ___ | ___ | Bone | ___ | ___ | Fibroid tissue |
| ___ | ___ | Bone Cells | ___ | ___ | Finger Joints |
| ___ | ___ | Bone Tissue | ___ | ___ | Gallbladder |
| ___ | ___ | Brachial Plexus | ___ | ___ | Gastorcnemus Muscle |
| ___ | ___ | Brain-3RD Ventricle | ___ | ___ | Glandulae Vestibulis Majores |
| ___ | ___ | Brain-Cerebra – Aqueduct | | | |
| | | Brain-Lateral Ventricle | ___ | ___ | Glandulae Vestibulis Minores |
| ___ | ___ | Brain-Left Temporal Lobe | ___ | ___ | Head of Pancreas |
| | | | ___ | ___ | Heart |
| ___ | ___ | Brain-Viso-Sensory | ___ | ___ | Heart Tissue |
| ___ | ___ | Brain-Cerebral Cortex | ___ | ___ | Heart Valves |
| ___ | ___ | Brain-Whole | ___ | ___ | Ileo-Cecal Valve |
| ___ | ___ | Brain: 4th Ventricle | ___ | ___ | Ileum |
| ___ | ___ | Brain: Audio Sensory Area | ___ | ___ | Inner Ear |
| | | | ___ | ___ | Internal Pudendal Nerve |
| ___ | ___ | Brain: Epithalamus | ___ | ___ | Internal Pudendal Vein |
| ___ | ___ | Brain: Frontal Lobe | ___ | ___ | Internal Thoracic Artery |
| ___ | ___ | Brain: Pons | ___ | ___ | Intestinal Flora |
| ___ | ___ | Brain: Reading (Visual/Speech) Area | ___ | ___ | Intestines |
| | | | ___ | ___ | Islets of Langerhans |
| ___ | ___ | Brain: Respiratory Centre | ___ | ___ | Joints |
| | | | ___ | ___ | Kidney Cortex |
| ___ | ___ | Brain: Rhinencephalon | ___ | ___ | Kidney Tissue |
| ___ | ___ | Brain: Rhomben-cephalon | ___ | ___ | Kidneys |
| | | | ___ | ___ | Knee Joint – Medial Meniscus |
| ___ | ___ | Brain: Right Hemisphere | | | |
| | | | ___ | ___ | Knee Joints |

FIGURE 3B

MAGNETIC RESONANCE SCREENING PANEL

| Normal | Abnormal | Organ/Tissue | Normal | Abnormal | Organ/Tissue |
|---|---|---|---|---|---|
| | | Mucous Membrane | | | Respiratory Organs |
| | | Mucous Membrane of Colon | | | Saphenous Nerves |
| | | | | | Sciatic Nerve |
| | | Mucous Tissue | | | Seminal Vesicles |
| | | Muscle Fibres | | | Sigmoid Colon |
| | | Muscle – Involuntary | | | Sinus Maxillaris |
| | | Muscular Tissue | | | Sinuses |
| | | Myelin Sheath | | | Skin |
| | | Nasal Cavities | | | Skin Corium (Dermis) |
| | | Nasal Mucous Membrane | | | Small Intestine |
| | | | | | Small Intestine Tissue |
| | | Nasal Sinuses | | | Small Saphenuus Vein |
| | | Nerve Tissue | | | Smooth Muscle |
| | | Nerves (general) | | | Solar Plexis |
| | | Ovarian Tissue | | | Spermatic Cord |
| | | Ovaries | | | Spinal Cord |
| | | Pancreas | | | Spinal Cord Tissue |
| | | Pancreas Tissue | | | Spinal Cord – Motive Fibres |
| | | Pancreas – Alpha Cells | | | |
| | | Pancreas – Beta Cells | | | Spinal Cord – Sensory Fibres |
| | | Pancreas – Endocrine Portion | | | |
| | | | | | Spinal Nerves |
| | | Pancreatic Duct | | | Spine |
| | | Parathyroid Gland | | | Spleen |
| | | Paratiod Gland | | | Stomach |
| | | Parietal Nerves | | | Stomach Tissue |
| | | Pelvis | | | Striated Muscle Tissue |
| | | Peritoneum | | | Sub-Maxillary Gland |
| | | Peroneal Nerve – Common | | | Sublingual Gland |
| | | | | | Superficial Peroneal Nerves |
| | | Peroneal Nerve – Deep | | | |
| | | Peroneal Nerve – Superficial | | | Sweat Glands |
| | | | | | Sympathetic Nerve Fibres |
| | | Pineal Gland (Epiphisine) | | | |
| | | | | | Sympathetic Nervous System |
| | | Pituitary Gland Posterior Lobe | | | |
| | | | | | Synovial Membranes |
| | | Pituitary Lobe Anterior Lobe | | | Tendons |
| | | | | | Thalamus |
| | | Pituitary Whole Gland (Hypophisine) | | | Throat |
| | | | | | Thymus Gland |
| | | Prostate Gland | | | Thyroid Gland |
| | | Pudendal Nerve | | | Tibial Veins – Anterior |
| | | Pulmonary Artery | | | Tibial Veins – Posterior |
| | | Pulmonary Trunk Valve | | | Tongue |
| | | Pyloric Valve | | | Tonsils |
| | | Pylorus | | | Trachea |
| | | Radial Nerve | | | Urinary Bladder |
| | | Rectal Veins | | | Uterus |
| | | Rectum | | | Uterus – Lining of |
| | | Rectus Femoris Muscle | | | Uvula |
| | | Red Bone Marrow | | | Vagus Nerve |

FIGURE 3C

MAGNETIC RESONANCE SCREENING PANEL

| Normal | Abnormal | Organ/Tissue | Normal | Abnormal | Organ/Tissue |
|---|---|---|---|---|---|
| ___ | ___ | Basal Lamina | ___ | ___ | Nerves |
| ___ | ___ | Capillaries | ___ | ___ | Nerves – From Ciliary Ganglion |
| ___ | ___ | Choriocapillary (Lamina) | ___ | ___ | Nrv-From-Ciliary Nrv & Occulomotor Nrv |
| ___ | ___ | Choroid | ___ | ___ | Opthalmic Nerve |
| ___ | ___ | Ciliary Body | ___ | ___ | Opthalmic Nerve |
| ___ | ___ | Ciliary Muscle | ___ | ___ | Opthalmic Vessels |
| ___ | ___ | Ciliary Processes | ___ | ___ | Optic Nerve – Left |
| ___ | ___ | Ciliary Ring | ___ | ___ | Optic Nerve – Right |
| ___ | ___ | Cornea (Left) | ___ | ___ | Optic Nerves |
| ___ | ___ | Cornea (Right) | ___ | ___ | Palpebral, Commissures – Left |
| ___ | ___ | Corneal Epithelium | ___ | ___ | Palpebral, Commissures – Right |
| ___ | ___ | Corneal Spaces | ___ | ___ | Palpebral – Left |
| ___ | ___ | Eye (Left) | ___ | ___ | Palpebral – Right |
| ___ | ___ | Eye (Right) | ___ | ___ | Pectinate Ligament of (Iris) |
| ___ | ___ | Eyeball | ___ | ___ | Pnctum Lcrimles – Lft (Mth/Lcrml Dct) |
| ___ | ___ | Eyelid (Left) | ___ | ___ | Posterior Elastic (Lamina) |
| ___ | ___ | Eyelid (Right) | ___ | ___ | Punctum Lacrimales – Right |
| ___ | ___ | Eyelid – Conjunctive, left | ___ | ___ | Pupil |
| ___ | ___ | Eyelid – Conjunctive, right | ___ | ___ | Retina |
| ___ | ___ | Eyelid – Lymph Glands | ___ | ___ | Retinal Tissues |
| ___ | ___ | Eyelid – Superior Tarsus | ___ | ___ | Retinia – Aqueoue Humour |
| ___ | ___ | Eyelid – Tarsal Gland, left | ___ | ___ | Retinia – Arteries |
| ___ | ___ | Eyelid – Tarsal Gland, right | ___ | ___ | Retinia – Ganglionio Layer |
| ___ | ___ | Fibres of the Lens | ___ | ___ | Retinia – Inner Nuclear Layer |
| ___ | ___ | Fiborous Coat | ___ | ___ | Retinia – Inner Plexiform Layer |
| ___ | ___ | Iris – Layer Endothelial Cells | ___ | ___ | Retinia – Layer of Rods & Cones |
| ___ | ___ | Iris – left | ___ | ___ | Retinia – Left |
| ___ | ___ | Iris – Pupil | ___ | ___ | Retinia – Macula Lutea |
| ___ | ___ | Iris – right | ___ | ___ | Retinia – Outer Nuclear Layer |
| ___ | ___ | Lacrimal Duct – Left | ___ | ___ | Retinia – Outer Plexiform Layer |
| ___ | ___ | Lacrimal Duct – Right | ___ | ___ | Retinia – Right |
| ___ | ___ | Lacrimal Gland | ___ | ___ | Retinia – Stratum Opticum |
| ___ | ___ | Lacrimal Sac – Left | ___ | ___ | Retinia – Vitreous Body |
| ___ | ___ | Lacrimal Sac – Right | ___ | ___ | Retinitis Pigmentosa |
| ___ | ___ | Lacus Lacri – left (Triangular Spots) | ___ | ___ | Rods of Retina |
| ___ | ___ | Lacus Lacrimalis – right | | | |
| ___ | ___ | Lamellae | | | |
| ___ | ___ | Lens – Capsule | | | |
| ___ | ___ | Lens – Left | | | |
| ___ | ___ | Lens – Nucleus | | | |
| ___ | ___ | Lens – Orbital Cavity | | | |
| ___ | ___ | Lens – Ortbital Muscle | | | |
| ___ | ___ | Lens – right | | | |

FIGURE 3D

MAGNETIC RESONANCE SCREENING PANEL

| Normal | Abnormal | Organ/Tissue | Normal | Abnormal | Organ/Tissue |
|---|---|---|---|---|---|
| ___ | ___ | Ankle Bone | ___ | ___ | Impinged Nerve |
| ___ | ___ | Arthritic Joints | ___ | ___ | Inflamed Joints |
| ___ | ___ | Auditory Nerve | ___ | ___ | Internal Pudendal Nerve |
| ___ | ___ | Bone | ___ | ___ | Jaw Bone |
| ___ | ___ | Bone Disease | ___ | ___ | Joints |
| ___ | ___ | Bone tissue | ___ | ___ | Joints (sore) |
| ___ | ___ | Bones (Broken) | ___ | ___ | Knee Joint – Lateral Meniscus |
| ___ | ___ | Capsule of Hip Joint | | | |
| ___ | ___ | Cervical Nerve 1st(Ant. Division) | | | Lens – Orbital Muscle |
| | | | ___ | ___ | Lumbar Nerve – $1^{st}$ |
| ___ | ___ | Cervical Nerve 1st (Post Division) | ___ | ___ | Lumbar Nerve – $2^{nd}$ |
| | | | ___ | ___ | Lumbar Nerve – $3^{rd}$ |
| ___ | ___ | Cervical Nerve 2nd (Ant. Division) | ___ | ___ | Lumbar Nerve – $4^{th}$ |
| | | | ___ | ___ | Lumbar Nerve – $5^{th}$ |
| ___ | ___ | Cervical Nerve 2nd (Post Division) | ___ | ___ | Lumbar Nerves |
| | | | ___ | ___ | Malar Bone |
| ___ | ___ | Cervical Nerve 3rd (Ant. Division) | ___ | ___ | Mandibular Nerve |
| | | | ___ | ___ | Masseter Muscle |
| ___ | ___ | Cervical Nerve 3rd (Post Division) | ___ | ___ | Median Nerve |
| | | | ___ | ___ | Motor Nerves |
| ___ | ___ | Cervical Nerve 4-8th (Post Division) | ___ | ___ | Muscle Strain |
| | | | ___ | ___ | Muscles – Involuntary |
| ___ | ___ | Cervical Nerve 4th (Ant. Division) | ___ | ___ | Nerve Endings |
| | | | ___ | ___ | Nerve Heart |
| ___ | ___ | Cervical Nerve 5-8th (ant. Division) | ___ | ___ | Nerve Tissue |
| | | | ___ | ___ | Nerves |
| ___ | ___ | Ciliary Muscle | ___ | ___ | Nerves (general) |
| ___ | ___ | Coccygeal Nerve | ___ | ___ | Nerves – From Ciliary Ganglion |
| ___ | ___ | Coccygeal Nerve Plexus | | | |
| | | | ___ | ___ | Obturator Nerve |
| ___ | ___ | Cranial Nerve Neuralgia | ___ | ___ | Opthalmic Nerve |
| | | | ___ | ___ | Optic Nerves |
| ___ | ___ | Dorsal Nerve 10th | ___ | ___ | Organic Bone Materials |
| ___ | ___ | Dorsal Nerve 11th | ___ | ___ | Painful Joints |
| ___ | ___ | Dorsal Nerve 12th | ___ | ___ | Parietal Nerves |
| ___ | ___ | Dorsal Nerve 1st | ___ | ___ | Peripheral Nerve Endings |
| ___ | ___ | Dorsal Nerve 2nd | | | |
| ___ | ___ | Dorsal Nerve 3rd | ___ | ___ | Peroneal Nerve – Common |
| ___ | ___ | Dorsal Nerve 3rd | | | |
| ___ | ___ | Dorsal Nerve 4th | ___ | ___ | Peroneal Nerve – Deep |
| ___ | ___ | Dorsal Nerve 5th | ___ | ___ | Peroneal Nerve – Superficial |
| ___ | ___ | Dorsal Nerve 6th | | | |
| ___ | ___ | Dorsal Nerve 7th | ___ | ___ | Pudendal Nerve |
| ___ | ___ | Dorsal Nerve 8th | ___ | ___ | Radial Nerve |
| ___ | ___ | Enlarged Joints | ___ | ___ | Rectus Femoris Muscle |
| ___ | ___ | Finger Joints | ___ | ___ | Sacral Vertibrae |
| ___ | ___ | Frontal Bone | ___ | ___ | Sacro Iliac Joint |
| ___ | ___ | Gastrocnemus Muscle | ___ | ___ | Saphenous Nerves |
| ___ | ___ | Hemorrhoidal Nerve Plexus | ___ | ___ | Sciatic Nerve |
| | | | ___ | ___ | Sensory Nerves |
| ___ | ___ | Hip Joint Cartilage | ___ | ___ | Shoulder Joints |
| ___ | ___ | Hip Joints | | | |

FIGURE 3E

MAGNETIC RESONANCE SCREENING PANEL

| Normal | Abnormal | Organ/Tissue | Normal | Abnormal | Organ/Tissue |
|---|---|---|---|---|---|
| ___ | ___ | Angina Pactoris | ___ | ___ | Heart Enlarged |
| ___ | ___ | Aorta | ___ | ___ | Heart Failure |
| ___ | ___ | Aortic Valve | ___ | ___ | Heart Palpitations |
| ___ | ___ | Arterial Tissue | ___ | ___ | Heart Tissue |
| ___ | ___ | Arterioles | ___ | ___ | Heart Valves |
| ___ | ___ | Atriovent (Tricspd) Vlve-Rtt | ___ | ___ | Mitral Stenosis |
| | | | ___ | ___ | Mitral Valve |
| ___ | ___ | Atrium of Heart – left | ___ | ___ | Oedema – Cardiac Origin |
| ___ | ___ | Atrium of Heart – right | | | |
| ___ | ___ | Atrovent (Bicuspd) Vlve-Lt | ___ | ___ | Tachycardia |
| | | | ___ | ___ | Vein Tissue |
| ___ | ___ | Cardiac Pacemaker | ___ | ___ | Vena Cava Inferior |
| ___ | ___ | Cardio-Vascular Organs | ___ | ___ | Vena Cava Superior |
| ___ | ___ | Heart | ___ | ___ | Ventricle of Heart – Left |
| ___ | ___ | Heart Disease | | | |
| | | | ___ | ___ | Ventricle of Heart – Right |

AUTOMATED COMPUTERIZED MAGNETIC RESONANCE DETECTOR AND ANALYZER

This application is a continuation-in-part of U.S. Ser. No. 08/229,605, filed Apr. 19, 1994, (pending) which is a continuation-in-part of U.S. patent application Ser. No. 07/945,529, filed on Sep. 16, 1992, now issued as U.S. Pat. No. 5,317,265.

BACKGROUND OF THE INVENTION

The application of a magnetic field and the subsequent measurement of the magnetic resonance properties of a material is well established. When a magnetic field is applied to an atom, either the resonance pattern of the nucleus, more specifically the protons, or of the electrons can be measured. The first application has become known as nuclear resonance (NMR) while the latter is referred to as electron paramagnetic resonance (EPR).

NMR has been widely used in the field of imaging of the human body. In NMR imaging, a relatively high magnetic field, i.e., on the order of 1 T to 4 T, is applied which causes the previously randomly oriented protons to realign and precess at a specific frequency. This frequency is called the Larmor frequency, and it is proportional to the local strength of the magnetic field at the position of the proton. A second magnetic field or burst of energy is applied to increase the energy of the nuclear proton. Typically, the frequency of this second field is in the range of about 1 megahertz (MHz) to 10 gigahertz (GHz). When the second magnetic field or energy source is turned off, the return of the protons to the first alignment state releases energy. Sensors are provided for sensing the rate of relaxation or energy release of the protons and subsequently generating a signal in the time domain that is referred to as the free induction decay (FID) signal. This signal is then analyzed using a Fourier transform to develop a spectrum of signals in the frequency domain. Analytical means may also be provided for receiving and analyzing the signals emitted, discriminating between various peaks, comparing the amplitude or height of various peaks, and/or normalizing the analysis by reference to a standard sample.

The use of NMR has been widely accepted for imaging purposes, because of the non-invasive nature of the technique and because it does not expose the patient to potentially harmful radiation as is used in conventional radiographic imaging. However, NMR imaging apparatuses require large magnetic fields and are usually physically quite large. Additionally, NMR imaging apparatuses have relatively high electrical consumption loads. In general, NMR imaging apparatuses are expensive to both manufacture and operate, and have thus, not been used extensively in areas of diagnosis and treatment.

However, one diagnostic application of NMR has been described in U.S. Pat. No. 5,072,732 issued to Rapoport et al. on Dec. 17, 1991. This patent describes a NMR apparatus which is used for non-invasively testing body fluids for a particular constituent, such as glucose in blood. In this particular NMR apparatus, the device is adapted to receive an extremity of the patient, such as a finger, in order to test the constituents found in the blood. The extremity is exposed to a first magnetic field having a field strength of at least five to six kilogauss. A coil apparatus, comprised of either a single or multiple coil, is used to apply a second field or energy to the test sample. In this particular apparatus, a radio frequency (RF) generator is used to produce this second field or energy. This coil apparatus also functions as the sensor for detecting the energy released (i.e., the FID) until the second field or energy is removed. Analytical means (i.e., electronic circuitry) are connected to the sensor coils for receiving and analyzing the signals emitted, discriminating between various peaks, comparing the amplitude or height of the various peaks that are attributed to the various constituents such as water and glucose, and for normalizing the analysis by reference to a standard sample so as to obtain the concentration of constituents in the tested materials. In using this particular NMR apparatus, a standard sample containing predetermined amounts of the materials to be tested is placed in the device and measured. This field measurement is compared against a previously stored, known spectrum for the particular constituent in order to normalize and quantify the substance being tested in the body fluid.

As noted previously, the second type of magnetic resonance technology involves measuring the resonance properties of electrons. The measurement of electron paramagnetic resonance is usually made at frequencies in the microwave range, i.e., on the order of 1000 MHz and above. One such electron paramagnetic resonance apparatus, is described in U.S. Pat. No. 4,455,527 issued to Singer on Jun. 19, 1984. In this apparatus, a sample to be measured is placed in a waveguide cavity, which also functions to concentrate the microwaves. The sample can be in several different forms including a solid or liquid of a specific column or weight or a continuous flow of liquid through an electrically insulating conduit. Additionally, this patent teaches that the local magnetic field around the sample must be at a level for which the sample exhibits a maximum resonance absorption. For microwave frequencies, all that is stated in this patent is that this magnetic field is much higher than the magnetic field produced by the earth.

As can be observed from the above discussion, all of the known nuclear and electron magnetic resonance devices require the use of relatively strong magnetic fields, i.e., fields exhibiting at least 100 gauss, but more typically in the 2000–4000 gauss range. In contrast, the magnetic resonance device of the present invention uses a significantly smaller magnetic field, i.e., in the range of 0.5 to 7 gauss.

In addition, the magnetic resonance analyzer of the present invention measures the degree and type of response of the matter under test, and by comparison with reference matter, it assists in recognizing deviations from a desired response. This capability is enhanced by testing with resonance test patterns which relate to the significant characteristics for the particular matter under test. The basis for the magnetic resonance effects of the present invention include proton excitation, manipulation of molecular oscillation, cellular membrane oscillation, and/or electron spin alternation.

Thus, in view of the above differences, the inventive magnetic resonance analyzer offers new advantages in the field of material analysis. Because the present invention uses much lower magnetic fields, it is safer and has less side effects than the prior art devices. In addition, the present inventions have a greater range of applications than the prior art devices and can be optimized for a given task by the use of the proper resonance pattern.

SUMMARY OF THE INVENTION

This invention is directed to an apparatus for generating a sequence of electromagnetic test patterns for generating a response signal of a matter under test and/or treatment. This apparatus comprises:

a sequence controller for generating control signals including a first control signal and a second control signal;

first means for generating a first electrical signal in response to said first control signal;

second means for generating a second electrical signal in response to said second control signal;

modulating means for modulating said second signal with said first signal and providing a third electrical signal;

first inductor means for generating an electromagnetic field controlled by said third electrical pattern signal, said first inductor means being adapted to subject said matter under test to said electromagnetic field;

said sequence controller including means for providing a selected sequence of said first and second control signals for generating sequence of selected electromagnetic patterns;

second inductor means for sensing an electromagnetic field in close proximity to said matter under test and providing a fourth electrical signal, said fourth electrical signal being indicative for the electromagnetic field generated by said first inductor means and the resonance magnetic field of said matter under test;

means for comparing said third electrical signal with said fourth electrical signal and providing an internal difference signal, said internal difference signal being indicative of the magnetic resonance characteristic of said matter under test;

means for analyzing said difference signal thereby providing an analyzed difference signal for every one of said test patterns.

Another embodiment of this invention is directed to a method for analyzing and altering the natural resonance signature of a substance. In this embodiment, the method comprises the steps of:

modulating a magnetic field having a strength of about 0.5 to 7 gauss with a first set of pattern signals wherein the first set of pattern signals is comprised of a partial spectrum of test pattern signals;

subjecting a substance to the modulated magnetic field;

measuring the resultant resonance peaks, wherein each peak represents either an in-phase or an out-of-phase resonance;

applying a second set of signals to either increase, decrease, flatten or nullify each at least one out-of-phase resonance peak.

BRIEF DESCRIPTION OF THE DRAWINGS

FIGS. 2A–2B are a schematic block diagram of one signal generator and a carrier frequency generator using a radio frequency carrier.

FIG. 3 (sheets 1–6) is a list of organs and tissues that are screened using one of the embodiments of the invention described herein.

DETAILED DESCRIPTION OF THE INVENTION

Figure 1:
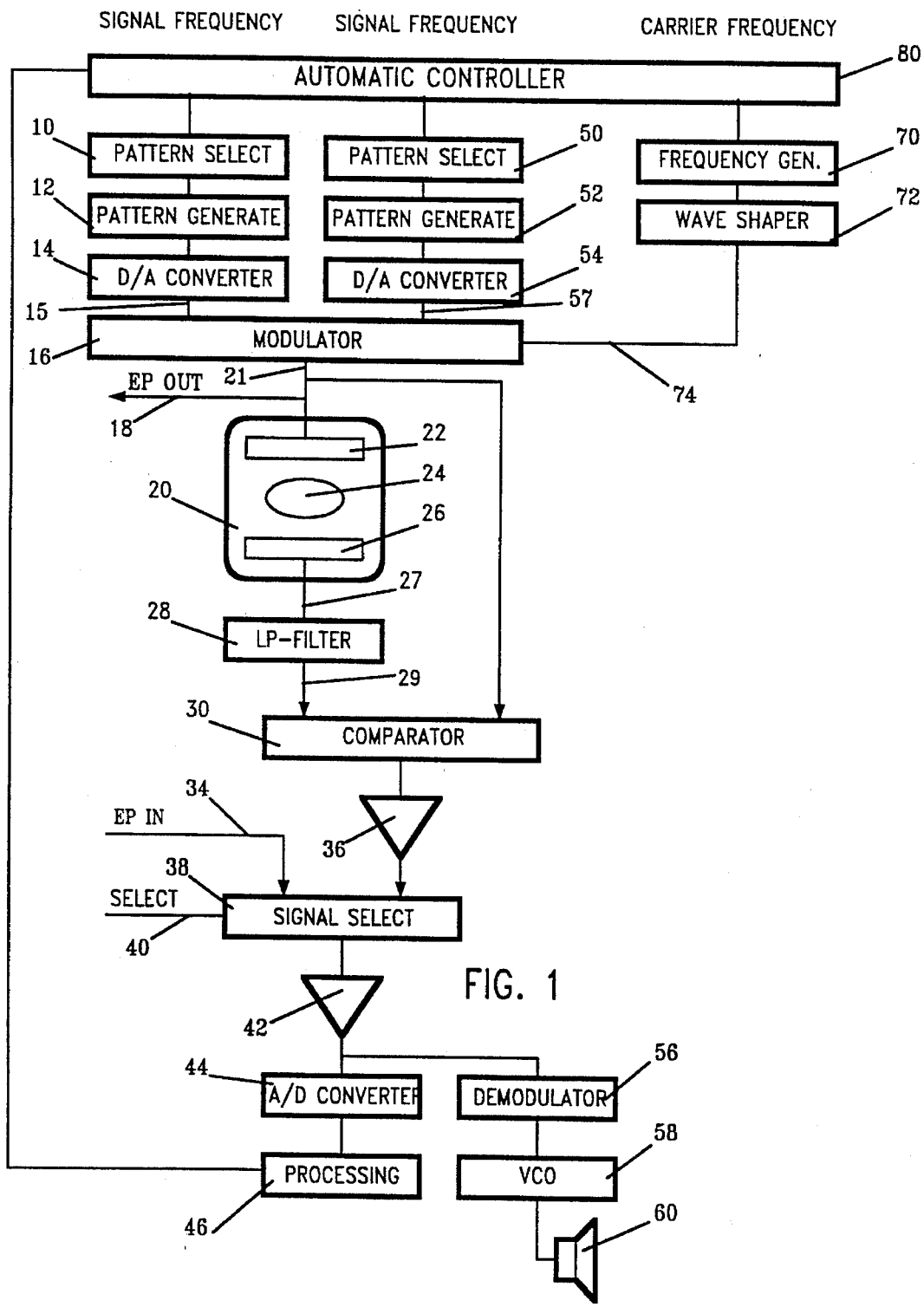
FIG. 1 is a schematic block diagram of the magnetic resonance analyzer and the automatic pattern control of the present invention.

The present invention is directed to magnetic resonance instrumentation and methods using this instrumentation. One aspect of the invention is the magnetic resonance apparatus (hereinafter referred to as the "MRA") which can be used to analyze, diagnose, and/or treat matter. In general, the MRA is used to transmit a synthesized resonance pattern into the subject matter under test which encounters the inherent resonance pattern produced by the tested subject matter. This information is returned to the MRA, which, after removing the static capacity and resistance, is analyzed, digitized and compared to a coded predetermined resonance pattern and examined for irregularities. The presence or lack of irregularities can be used to analyze and diagnose matter. A second set of test pattern signals can also be applied to alter the substance's natural magnetic resonance, thereby treating the substance to achieve a particular resonance pattern. Another aspect of the invention is directed to methods for analyzing and/or treating substances.

These inventions can be used to analyze a variety of substances including, but not limited to, elements, molecules (including water), and biological structures such as cells, tissues and organs, and chemicals. In general, the material to be analyzed must be placed adjacent to or within an electromagnetic field. Typically, the electromagnetic field is generated by passing a current through a primary winding; however, it is contemplated that a permanent magnet having a magnetic strength in the range of about 0.1 to 10 gauss could also be used in the inventive MRA. In some embodiments of the invention, a secondary winding is used to sense the sum of the applied magnetic field and the response field of the material being analyzed. Types of structures which are suitable for both the primary and secondary windings include, but are not limited to, cylindrical, flat and conical coils. The primary and secondary windings may be concentric with the primary winding being the inner coil (and, thus, the outer coil is the secondary winding). Alternatively, the secondary winding will be the inner coil while the primary winding is the outer coil. Both coils may be electromagnetically shielded to eliminate any influence from an external electromagnetic field.

The basic design of the MRA invention includes at least one signal frequency generator and a carrier frequency generator. In the preferred embodiment, the MRA uses two signal frequency generators. Each of the two signal frequency generators include the same type of major components: pattern select means 10 and respectively, pattern generator 12 and 52, respectively, and digital to analog converters 14 and 54 respectively. The inputs of the digital-to-analog converters receive a sequence of binary coded values which are converted into analog signals. The two analog signals are supplied to modulator 16. The resultant analog signals contain the frequencies and patterns which will modulate the output of the frequency generator by the matter under test.

A frequency generator 70, such as a low frequency pulse generator, receives a carrier frequency signal and converts this carrier signal to a new frequency. The output signal of generator 70 is fed through a wave shaper 72 and drives the carrier input 74 of modulator 16. The output of modulator 16 provides the test pattern signal in which the carrier frequency pattern is amplitude and/or frequency modulated by one or more signal frequency patterns. In one embodiment, the frequency spectrum of the test pattern signal ranges from 3 Hz to 14 Hz. In another embodiment, a frequency in the range of about 10 Hz to 350 Hz is used for the carrier frequency. In other embodiments, the carrier frequency is in the range of about 1 Hz to 100 KHz. Finally, a high voltage radio frequency carrier signal generated by the means shown in FIG. 2, may be used in some embodiments.

FIG. 2 shows two configurations in which the MRA is used to modulate high voltage radio frequency carrier signals. In FIG. 2-A carrier frequency is generated via a means 82 that includes a circuit which employs a high voltage tube, a tuned curcuit and a series of chokes to isolate the power supply from the output circuit. The carrier frequency generating means is connected to a modulator 83. The modulator 83 on the one hand is connected to modulator 16 of the MRA, and on the other to a means for creating treatment modulating waves 84, for example, a low voltage oscillator circuit consisting of Op Amps and passive components. The modulating waves so created control the plate current of the high voltage tube, thus amplitude modulating the output RF signal. The final output of the modulated high voltage radio frequency carrier signal is from a high voltage discharge tube 88 connected to the modulator of the MRA. The high voltage discharge tube in this configuration may only have two electrodes, but will usually have a third control electrode to which the MRA signals are applied.

The configuration in FIG. 2-B differs from that in FIG. 2-A in that the output of the means for creating treatment modulating waves (84) as well as that of the MRA via modulator (16) is summed by an electronic summing means ("ESN") (89) connected to the modulator (83) that modulates the high voltage radio frequency carrier signal that will be discharged from the high voltage discharge tube (88).

In FIG. 2 (including 2-A and 2-B) any of the connecting means 85, 86, 87, 90, 91 and 92 that connect the high voltage RF generator means, the means for creating the treatment modulating wave, and the modulators (16) and (83) with the high voltage discharge tube (88) may be electrical or optical in nature.

The output of the modulator 16 is a test pattern signal 21, which is an amplitude and/or frequency modulated signal of the carrier frequency signal. The spectral contents of this signal can be narrowed using any techniques that are known in the art. However, two techniques that are well suited for these inventions include 1) the use of high Q signal generators, with or without filters, and 2) the use of a series of filters including, but not limited to, low pass, band-bass, high-pass, passive, and active. In this latter technique, the series of filters should be optimally selected so as to eliminate all unwanted spectral contents of the signal generators while transmitting a signal within a desired frequency range. In some embodiments of the invention, the test pattern signal 21 is supplied to the primary winding or coil 22 which generates the electromagnetic test field. In other embodiments, the test pattern 21 is supplied to a probe which is placed in contact with the matter to be analyzed.

In those embodiments using a coil, the matter being analyzed 24 is placed within or adjacent to the coil. The coil may be located in a chamber 20. A secondary coil 26 senses the electromagnetic field that results from the applied electromagnetic field and the resonance pattern of the material being analyzed. The electrical output signal 27 of secondary coil 26 includes a component from the test pattern field and a component representing the resonance signal of the matter under test responding to the test field. A low-pass filter 28 eliminates all frequency components above a certain frequency. The resultant filtered signal is compared with the electrical test pattern signal in comparator 30. The difference signal is amplified in amplifier 36 and supplied to an electronic switch 38.

In the embodiments using a probe, the test signal 21 is supplied via output EP OUT 18 to an input test probe which can be inserted into or attached to the material under test. Several types of input probes are used in the various embodiments of this invention. Typically these embodiments are used to analyze and treat pain in human tissue and organs. One type is a metallic cylindrical probe having at least one electrode (referred to as the "hand probe"). A variation of this hand probe is a probe having at least one electrode plus one or more switches (referred to as the "button probe"). With both of these types of probes, the probe is applied to two different points on the matter to be analyzed during the course of a diagnostic test or treatment. A third type of probe is comprised in an inductive coil that is applied to or near a specific point on the matter being analyzed or treated, such as a nerve ending in the human body.

A fourth type of probe utilizes an inductive coil without an electrical carrier signal. A Fourier decomposition technique can be used in analyzing the output signal of the probe circuitry. An example of such a technique involves 1) displaying the signal using a Tektronix Model 7904 oscilloscope, 2) graphing and sampling the signal, and 3) inputting the data into an analysis program such as "PSPICE Transient."

Output sense probes can be inserted or attached at other locations of the material under test to identify the reaction of the material under test to the test signal. The output sense probes are to be connected to input EP IN 34. The detected signal is processed in the same manner as the signal from the secondary coil of the test chamber. When any of these probes are applied in the manners specified above, they allow 1) the transmission of a carrier signal and resonance pattern (5) to the material being tested, and 2) the transmission of a carrier signal and resonance pattern (5) to the analysis and response circuits of the MRA devices as discussed below.

A switch 38 is provided to select either the signal from the probe circuitry as connected through line 34, or the filtered signal from the test well circuitry before passing one of these signals on to the signal processing and output response circuitry of the MRA. In general test well circuitry is usually defined as being the output signal from the secondary coil 26 after it has been passed through a LP filter 28, comparator 30, and amplifier 36.

Switch 38 is controlled by a select signal on line 40. The selected output signal from switch 38 is amplified in amplifier 42 and provided to two evaluation channels. The first evaluation channel converts the received signal into a digital signal in D/A converter 44. The resultant digital signal can be evaluated, processed, stored, modified or otherwise treated in a processing device 46, such as a special or common purpose computer or an audio processing network for audio indication of the response. Furthermore, this output response signal may be transmitted to a computer for real time evaluation, processing or storage. In addition, the output response signal may be displayed using any display means including, but not limited to, LED bargraphs, 7-segment LED displays, liquid crystal displays (LCDs), CRTs, or printers.

The second evaluation channel includes a demodulator 56, a voltage controlled oscillator (VCO) 58 and an acoustic output device 60, such as a loudspeaker. The frequency or tune of the output signal from the VCO changes with variations of the response signal of the MRA. Since the output of the VCO controls the speaker, the tone produced by the speaker is an indication of the nature of an MRA diagnostic or treatment process.

The magnetic resonance analyzer can generate a large variety of signal patterns. For testing a particular matter, the optimum test pattern has to be determined which is specific to the particular matter and its evaluation. When testing a sample at a later time, the optimum test pattern is selected and imposed on the sample under test. The resultant resonance spectrum can be compared with the expected resultant test patterns and the user may draw conclusions from the differences. Important features of the resultant signals are the resonance responses and the frequencies showing extraordinary peak emissions.

To determine the resonance frequencies of a particular matter under test, the reference material is exposed to a plurality of test patterns and the resulting response is observed to determine which test pattern is to be used in testing against the reference matter.

In some embodiments of the MRA, an automatic controller 80 is used to supply sequential input control signals to the frequency generators and thereby generates for each set of control signals a particular frequency pattern. For each of the successive frequency patterns, the detected response is provided by processing means 46 and transferred via line 81 to controller 80, where it is recorded in a memory for further evaluation. The resulting response characteristics for the various frequency patterns are analyzed in controller 80 to determine which of the test patterns is to be used for testing material against their reference material. This analysis may select test patterns in accordance with the maximum amplitude of the difference signal received for each of the test patterns. It may select a test pattern in accordance with the strongest response signal sensed at the secondary coil, as represented by the largest difference signal over the frequency range of the applied test pattern.

Automatic controller 80 allows a reference matter to be scanned for a particular frequency pattern, and to subject matter under test to a sequence of test patterns for comparison with expected responses or stored responses of corresponding reference matter.

Automatic controller 80 may include selection means which, in response to an input of the matter to be tested, selects one or more of the previously determined test patterns for that particular matter and generates a test pattern sequence for the matter under test.

The basic MRA as described above can also be used in a method to analyze and treat human tissue and organs. Additionally, this same method can be used to analyze any substance and to alter the magnetic resonance of the substance for a variety of reasons. In general the method to alter the natural magnetic resonance of any substance includes the following steps:

modulating a magnetic field having a strength of about 0.1 to 7 gauss with a first set of pattern signals wherein the first set of pattern signals is comprised of a partial spectrum of test pattern signals;

subjecting a substance to the modulated magnetic field;

measuring the resultant resonance peaks, wherein each peak represents either an in-phase or an out-of-phase resonance; and applying a second set of signals to either increase, decrease, flatten or nullify at least one out-of-phase resonance peak.

As noted above, the basic MRA device can be used in a variety of applications. Table 1 below lists five specific MRA devices, their application, and a summary of the key components which comprise each device. Other applications of the basic MRA device described above include security systems, photoscan plate, mineral processing, dialysis systems and devices for the controlling the rates of fermentation, bacterial growth, and agricultural growth. Each of these devices would have similar key components as described for the five specific application listed below.

TABLE 1

| | KEY FEATURES OF MRD CORPORATION DEVICES | | |
|---|---|---|---|
| KEY FEATURES | MRA 1 SPECIAL | MRA CLASSIC | MRA MINI |
| Applications of device | Analysis of substances including human tissue and organs, pain treatment | Analysis of substances including human tissue and organs; pain treatment | Analysis of substances including human tissue and organs |
| Strength of magnetic field | .5 to 7 gauss | .5 to 7 gauss | .5 to 7 gauss |
| Type of primary coil | Cylindrical | Flat, rectangular in shape | Flat, rectangular in shape |
| Type of secondary coil used | Cylindrical, concentric with primary | Flat. In some coils secondary is the outer, while in others it is the inner winding | Flat. In some coils secondary is the outer while in others it is the inner winding |
| Number of signal frequency generators | 2 | 2 | 2 |
| Components used to create and shape each pattern signal (15 or 55) | pattern select, pattern generate, D/A converter | pattern select, pattern generate, D/A converter | pattern select, pattern generate, D/A converter |
| Nature of carrier frequency (74) | 3 Hz to 14 Hz. Optionally, RF carrier. | 1 Hz to 100 KHz. Optionally, RF carrier. | 1 Hz to 100 KHz. Optionally, RF carrier. |
| Components used to create and shape the carrier frequency | Low frequency pulse generator, wave shaper | Low frequency pulse generator, wave shaper | Low frequency pulse generator, wave shaper |
| Nature of the test | A wave obtained by | A wave obtained by | A wave obtained by |

TABLE 1-continued

| | | | |
|---|---|---|---|
| pattern signal (21) | modulating the carrier with appropriate resonance code. The maximum amplitude is approximately 10 V. | modulating the carrier with appropriate resonance code. The maximum amplitude is approximately 10 V. | modulating the carrier with appropriate resonance code. The maximum amplitude is approximately 10 V. |
| Probe and/or test well circuitry used | Both: hand probe available; a hand plate using a flat coil and a test well using a cylindrical coil are also available. | Both: hand probe available; a hand plate using a flat coil and a test well using a cylindrical coil are also available. | Both: hand probe available; a hand plate using a flat coil and a test well using a cylindrical coil are also available. |
| Components used to filter or otherwise modify the unfiltered resonance signal (27) | LP - filter | LP - filter | LP - filter |
| Components used to compare the modified resonance signal with the test pattern signal | Comparator; amplifier | Comparator; amplifier | Comparator; amplifier |
| Components used to further amplify, select or process the signal | Signal selector, etc. | Signal selector, etc. | Signal selector, etc. |
| Automatic Controller | Optional | Optional | Optional |

| KEY FEATURES | MRA DEDICATED PAIN TREATMENT DEVICE | INDUSTRIAL WATER TREATMENT DEVICE |
|---|---|---|
| Applications of device | Analysis and treatment of pain | Water analysis |
| Strength of magnetic field | .5 to 7 gauss | .5 to 7 gauss |
| Type of primary coil | Probes were used | Cylindrical or flat |
| Type of secondary coil used | Probes were used | |
| Number of signal frequency generators | 2 | 2 - because you want in-line analysis |
| Components used to create and shape each pattern signal (15 or 55) | PLDs, DACs, counters, RAMs, Eproms, OP AMPS, resistors, capacitors | pattern select, pattern generator, D/A converter |
| Nature of carrier frequency (74) | A pulse with a controllable frequency and duty cycle. The maximum amplitude about 10 V. Optionally, RF carrier. | A rectangular pulse, maximum amplitude: approx. 10 V, frequency range: 1 Hz to 100 KHz. Optionally, RF carrier. |
| Components used to create and shape the carrier frequency | 555 Timer, transistors, diodes, capacitors, resistors, potentiometers | Low frequency generator, wave shaper |
| Nature of the test pattern signal (21) | A pulse with spike on positive going edge. Peak pulse amplitude: 90 V Max spike amplitude: 170 V Frequency: 10 Hz to 350 Hz | A wave obtained by modulating the carrier with desired resonance code. The maximum amplitude is about 10 V. |
| Probe and/or test well circuitry used | Through a probe | Placing matter within or near a coil. |
| Components used to filter or otherwise modify the unfiltered resonance signal (27) | Passive or active filter | Passive or active filters |
| Components used to compare the modified resonance signal with the test pattern signal | Comparators | Comparators |
| Components used to further amplify, select or process the signal | Analog switches, buffers, potentiometers, OP Amps. | Buffers, amplifiers |
| Automatic Controller | Optional | Optional |

Described below is an example of the present inventions which is provided for illustrative purposes only, and not to limit the scope of the present invention. In light of the present disclosure, numerous embodiments within the scope of the claims will be apparent to those of ordinary skill in the art.

EXAMPLE 1

The inventive MRA can be used to analyze a variety of systems of the human body including but not limited to, the digestive, endocrine, cardiovascular, respiratory, reproductive, urinary, orthopedic, as well as a variety of pathogens. More particularly, the screening panel shown in FIG. 3 may be used in conjunction with the inventive MRA to analyze the overall health of a patient. In general, for each of the organs shown in this panel, a natural resonance signature is established empirically or by reference to published values. These natural resonance signatures are entered into the memory of the controller. The patient is placed adjacent to the magnetic field. Next, a number of test pattern signals are provided sequentially to modulate the magnetic field. For each signal applied, the resultant sum of the modulated magnetic field and each organ's or tissue's natural resonance is sensed by the secondary coil. This sensed signature is processed as described above and is provided as an input to the controller. Once each summation resonance signal has been recorded for each organ listed in the panel, each signal is evaluated to determine whether it represents a normal, in-phase signal or an abnormal, out of phase signal. For each out of phase signal found, a correction signal is applied to either increase, decrease, or nullify the organs' natural resonance signature.

We claim:

1. A method for analyzing and altering the natural resonance signature of a substance, the method comprising the steps of:

modulating a magnetic field having a strength of about 0.5 to 7 gauss with a first set of pattern signals wherein the first set of pattern signals is comprised of a partial spectrum of test pattern signals;

subjecting a substance to the modulated magnetic field;

measuring the resultant resonance peaks, wherein each peak represents either an in-phase or an out-of-phase resonance;

applying a second set of signals to either increase, decrease, flatten or nullify each at least one out-of-phase resonance peak.

* * * * *